United States Patent
Sekiya

(10) Patent No.: US 8,021,963 B2
(45) Date of Patent: Sep. 20, 2011

(54) WAFER TREATING METHOD

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 36 days.

(21) Appl. No.: 12/482,291

(22) Filed: Jun. 10, 2009

(65) Prior Publication Data

US 2010/0009549 A1    Jan. 14, 2010

(30) Foreign Application Priority Data

Jul. 11, 2008 (JP) .................................. 2008-181167

(51) Int. Cl.
  *H01L 21/46* (2006.01)
(52) U.S. Cl. ......................................... 438/459; 438/795
(58) Field of Classification Search .................. 438/795, 438/459
  See application file for complete search history.

(56) References Cited

U.S. PATENT DOCUMENTS

| | | | |
|---|---|---|---|
| 6,335,264 B1 * | 1/2002 | Henley et al. | 438/460 |
| 7,052,978 B2 * | 5/2006 | Shaheen et al. | 438/463 |
| 7,728,257 B2 * | 6/2010 | Watanabe | 219/121.82 |
| 7,811,900 B2 * | 10/2010 | Henley | 438/458 |
| 2005/0118823 A1 * | 6/2005 | Kawashima | 438/692 |
| 2005/0202596 A1 * | 9/2005 | Fukuyo et al. | 438/113 |

FOREIGN PATENT DOCUMENTS

| | | |
|---|---|---|
| JP | A 2005-317846 | 11/2005 |
| JP | A 2006-100786 | 4/2006 |

* cited by examiner

*Primary Examiner* — Thao X Le
*Assistant Examiner* — Kimberly Trice
(74) *Attorney, Agent, or Firm* — Greer, Burns & Crain, Ltd.

(57) ABSTRACT

A wafer treating method includes the steps of irradiating a wafer, provided with devices on the face side, from the back side with a laser beam capable of being transmitted through the wafer, while converging the laser beam to a predetermined depth, so as to form a denatured layer between the face side and the back side of the wafer, and separating the wafer into a back-side wafer on the back side relative to the denatured layer and a face-side wafer on the face side relative to the denatured layer. The denatured layer remaining in the face-side wafer is removed, and the face-side wafer is finished to a predetermined thickness, whereby the devices constituting the face-side wafer are finished into products, and the back-side wafer is recycled.

5 Claims, 9 Drawing Sheets

US 8,021,963 B2

WAFER TREATING METHOD

BACKGROUND OF THE INVENTION

1. Field of the Invention

The present invention relates to a water treating method including irradiating a water with a laser beam so as to form a denatured layer in the inside of the water, and thereby to separate the wafer into a back-side wafer and a face-side wafer.

2. Description of the Related Art

Devices such as ICs and LSIs utilized for various electronic apparatuses are manufactured by slicing a semiconductor ingot such as a silicon ingot to form wafers each of which serves as a base for the devices, grinding both sides of the wafer and polishing a surface of the wafer to mirror finish the surface, and fabricating circuits at the mirror-finished surface (refer to, for example, Japanese Patent Laid-open No. 2006-100786 and Japanese Patent Laid-open No. 2005-317846).

In the process of manufacturing the devices starting from the semiconductor ingot, however, most part of the semiconductor is discarded, which is extremely uneconomical. Specifically, it is known that let the volume of the semiconductor ingot be 100%, then the volume discarded during the step of slicing the semiconductor ingot to form wafers used as bases is 20%, the volume discarded during the step of mirror finishing the surface of the wafers is 20%, the volume discarded during the process in which the back side of the wafer provided with devices is ground to thin the wafer is 55%, and the volume discarded during the step of dicing the wafer into the individual devices is 1%. Thus, 96% of the silicon ingot is discarded, as is known.

SUMMARY OF THE INVENTION

Accordingly, it is an object of the present invention to provide a wafer treating method which makes it possible to reduce the amount of semiconductor discarded during the process of manufacturing semiconductor devices included of an expensive semiconductor such as silicon.

In accordance with an aspect of the present invention, there is provided a method of treating a wafer provided with a plurality of devices on the face side, the method including: a denatured layer forming step of irradiating the wafer from the back side with a laser beam having such a wavelength as to permit transmission the laser beam through the wafer, while adjusting a converging point of the laser beam to a predetermined depth from the back side, so as to form a denatured layer between the face side and the back side of the wafer; a separating step of separating the wafer into a back-side wafer on the back side relative to the denatured layer and a face-side wafer on the face side relative to the denatured layer; and a finishing step of removing the denatured layer remaining in the face-side wafer so as to finish the face-side wafer to a predetermined thickness. Preferably, the back-side wafer is recycled.

According to the present invention, a wafer is irradiated with a laser beam having such a wavelength as to permit transmission of the laser beam through the wafer so as to form the denatured layer between the face side and the back side of the wafer, and then the wafer is separated into the back-side wafer and the face-side wafer, so that the back-side wafer can be removed without being ground. Accordingly, the back-side wafer thus separated can be recycled, instead of being discarded.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
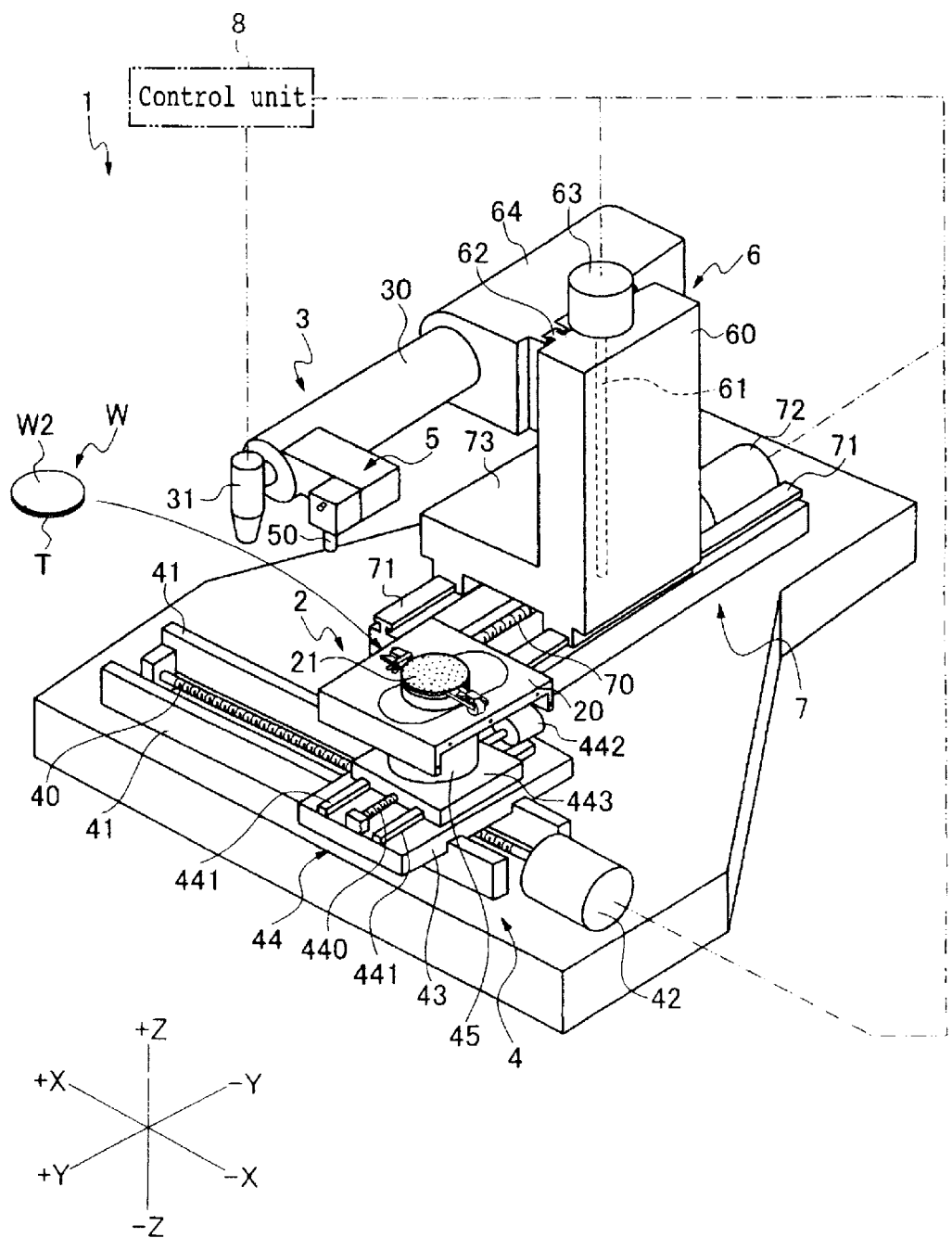
FIG. 1 is a perspective view showing an example of a laser beam processing apparatus.

A laser beam processing apparatus 1 shown in FIG. 1 is an apparatus for processing a wafer by irradiating the wafer with a laser beam to form a denatured layer in the inside of the wafer. The laser beam processing apparatus 1 includes a chuck table 2 for holding a wafer as a work to be processed, and laser beam irradiation means 3 for irradiating the work held on the chuck table 2 with a laser beam for processing.

The chuck table 2 is subjected to processing feed in an X-axis direction by processing feeding means 4. The processing feeding means 4 is means by which the chuck table 2 and the laser beam irradiation means 3 are put into relative processing feed in the X-axis direction. The processing feeding means 4 includes a ball screw 40 disposed along the X-axis direction, a pair of guide rails 41 disposed in parallel to the ball screw 40, a motor 42 connected to one end of the ball screw 40, a movable plate 43 which is provided therein with a nut engaged with the ball screw 40 and of which lower parts make sliding contact with the guide rails 41, position adjusting means 44 provided on the movable plate 43, and holding part turning means 45 capable of being moved in a Y-axis direction by being driven by the position adjusting means 44. Attendant on turning of the ball screw 40 under driving by the motor 42, the movable plate 43 and the position adjusting means 44 as well as the holding part turning means 45 are moved in the X-axis direction while being guided by the guide rails 41. The processing feeding means 4 is controlled by a control unit 8.

The position adjusting means 44 is included of a ball screw 440 disposed on the movable plate 43 in the Y-axis direction, a pair of guide rails 441 disposed in parallel to the ball screw 440, a pulse motor 442 connected to one end of the ball screw 440, and a movable plate 443 which is provided therein with a nut engaged with the ball screw 440 and of which lower parts make sliding contact with the guide rails 441. Attendant on turning of the ball screw 440 under driving by the pulse motor 442, the movable plate 443 and the holding part turning means 45 are moved in the Y-axis direction while being guided by the guide rails 441.

The chuck table 2 has a holding part 21 which can be rotated and be moved in the Y-axis direction. The holding part 21 is connected to the holding part turning means 45, and can be turned through a desired angle by being driven by a pulse motor (not shown) provided in the holding part turning means 45. In addition, a cover 20 is disposed which supports a bellows (not shown) arranged to be expandable and contractible in the X-axis direction.

The laser beam irradiation means 3 has a processing head 31 supported by a housing 30. The processing head 31 has a function of radiating a laser beam downwards, and the processing conditions such as output, frequency, etc. of the laser beam thus radiated are controlled by the control unit 8. Alignment means 5 having an image pickup unit 50 for picking up an image of the wafer is fixed to a side part of the housing 30. The alignment means 5 has a function of picking up an image of an exposed surface of the wafer and detecting the position of a portion to be processed.

The laser beam irradiation means 3 and the alignment means 5 can be moved in a Z-axis direction by Z-axis direction feeding means 6. The Z-axis direction feeding means 6 is included of a wall part 60, a ball screw 61 disposed on one side surface of the wall part 60 along the Z-axis direction, a pair of guide rails 62 disposed in parallel to the ball screw 61, a pulse motor 63 connected to one end of the ball screw 61, and a support part 64 which is provided therein with a nut engaged with the ball screw 61 and of which side parts make sliding contact with the guide rails 62. The support part 64 supports the housing 30 of the laser beam irradiation means 3. Attendant on turning of the ball screw 61 under driving by the pulse motor 63, the support part 64 is lifted up and down while being guided by the guide rails 62, whereby the laser beam irradiation means 3 supported on the support part 64 is also lifted up and down. The Z-axis direction feeding means 6 is controlled by the control unit 8.

The Z-axis direction feeding means 6 and the laser beam irradiation means 3 can be moved in the Y-axis direction by indexing feeding means 7. The indexing feeding means 7 is means by which the chuck table 2 and the laser beam irradiation means 3 are put into relative indexing feed along the Y-axis direction. The indexing feeding means 7 is included of a ball screw 70 disposed in the Y-axis direction, guide rails 71 disposed in parallel to the ball screw 70, a pulse motor 72 connected to one end of the ball screw 70, and a movable base 73 which is provided therein with a nut engaged with the ball screw 70 and of which lower parts make sliding contact with the guide rails 71. The movable base 73 is formed as one body with the wall part 60 constituting the Z-axis direction feeding means 6. Attendant on turning of the ball screw 70 under driving by the pulse motor 72, the movable base 73 and the wall part 60 are moved in the Y-axis direction while being guided by the guide rails 71, whereby the Z-axis direction feeding means 6 and the laser beam irradiation means 3 are moved in the Y-axis direction. The indexing feeding means 7 is controlled by the control unit 8.

Figure 2:
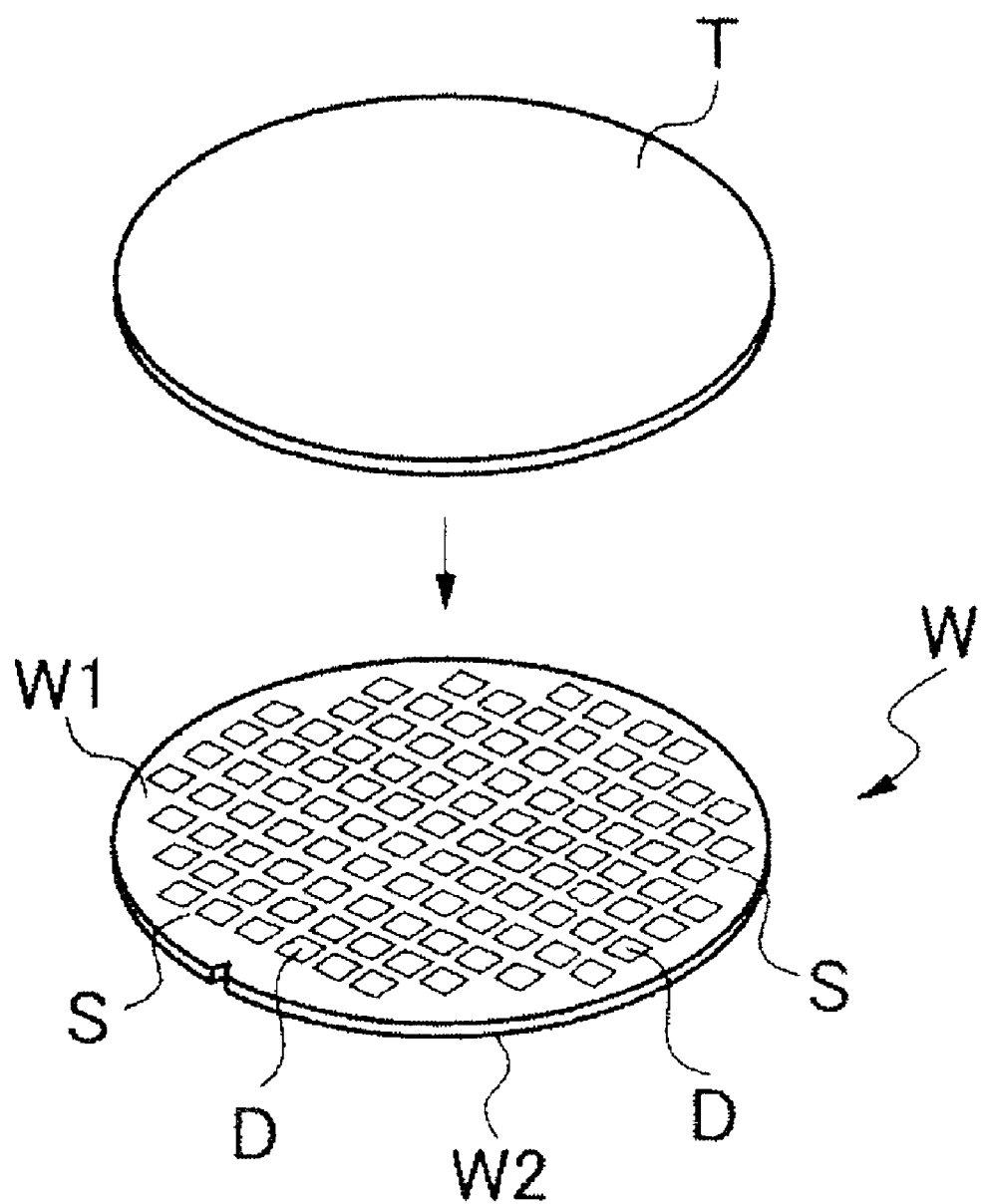
FIG. 2 is an exploded perspective view showing a wafer and a protective tape.
Figure 3:
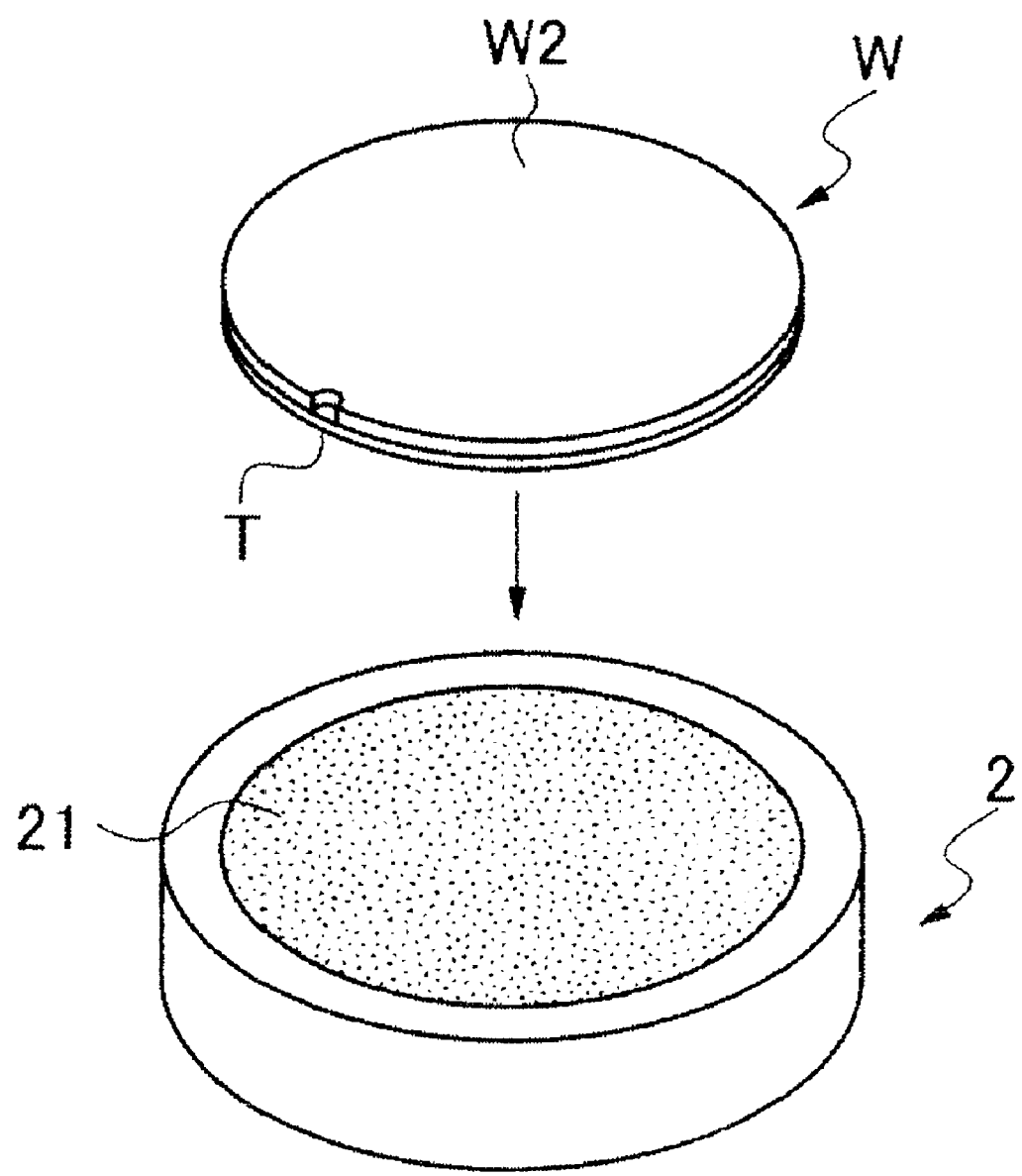
FIG. 3 is a perspective view showing the condition where the wafer with the protective tape adhered to the face-side surface thereof is held by a chuck table of the laser beam processing apparatus.

At a face-side surface W1 of a wafer W shown in FIG. 2, a plurality of devices D are formed in the state of being demarcated by planned dividing lines S. A protective tape T for protecting the devices D is adhered to the face-side surface W1 of the wafer W. Then, as shown in FIG. 3, the wafer W with the protective tape T adhered to the face-side surface W1 thereof is reversed face side back, and the protective tape T side is held on the chuck table 2 of the laser processing apparatus 1 shown in FIG. 1, resulting in a condition where the back-side surface W2 of the wafer W is exposed.

Figure 4:
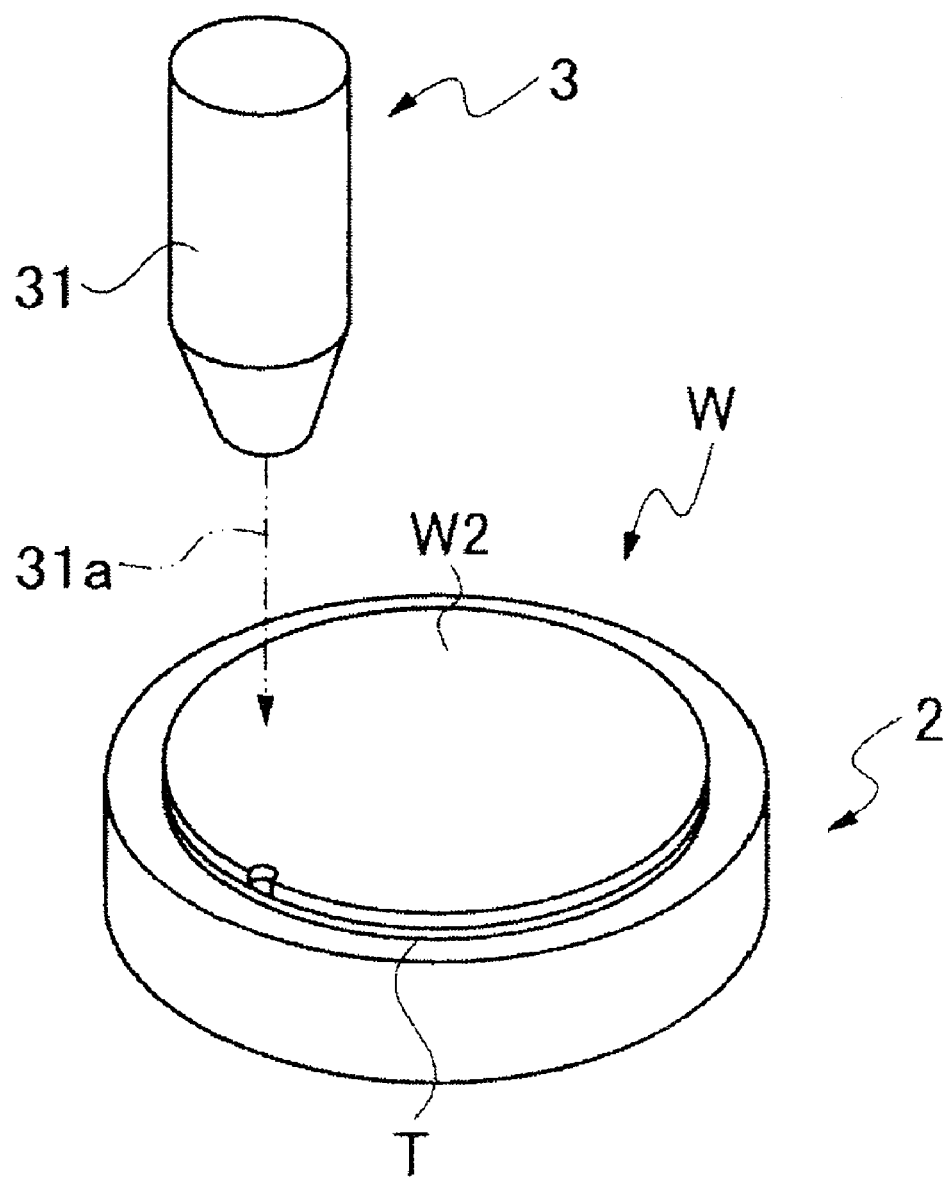
FIG. 4 is a perspective view showing the condition where the wafer is irradiated with a laser beam from the back side.

After the wafer W is held on the chuck table 2 in this manner, the chuck table 2 is moved in the X-axis direction so that the wafer W is positioned directly under the image pickup unit 50, the alignment means 5 detects an end part in the Y-axis direction of the wafer W, and alignment of the end part and the processing head 31 in the Y-axis direction is performed. Then, the chuck table 2 is further moved in the same direction, a laser beam 31a having such a wavelength as to permit transmission of the laser beam 31a through the wafer W is radiated from the processing head 31, as shown in FIG. 4, and the converging point of the laser beam 31a is adjusted to a position in the inside of the wafer W, i.e., a position between the back-side surface W2 and the face-side surface W1 of the wafer W, so as to form a denatured layer.

In this case, in the control unit 8 shown in FIG. 1, the processing conditions are set, for example, as follows, and actual processing is carried out under the processing conditions.

| | |
|---|---|
| Light source: | LD-excited Q-switch Nd: YVO4 laser |
| Wavelength: | 1064 nm |
| Output: | 1 W |
| Converging spot diameter: | Φ1 μm |
| Repetition frequency: | 100 kHz |
| Processing feed rate: | 100 mm/s |
| Indexing feed amount: | 20 μm |
| Incident surface: | Back-side surface |

Figure 5:
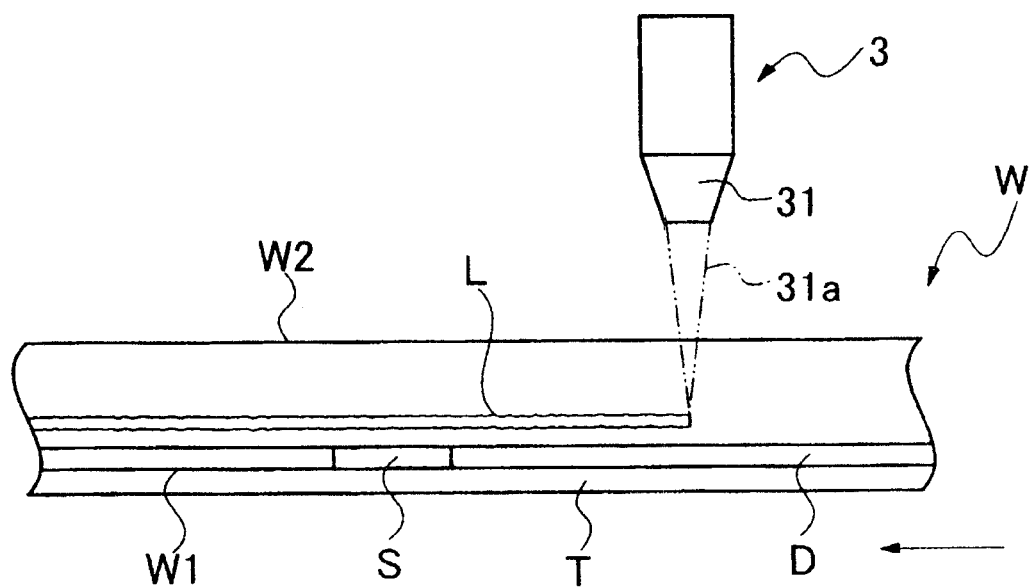
FIG. 5 is a front view showing the process in which a denatured layer is formed in a denatured layer forming step.
Figure 6:
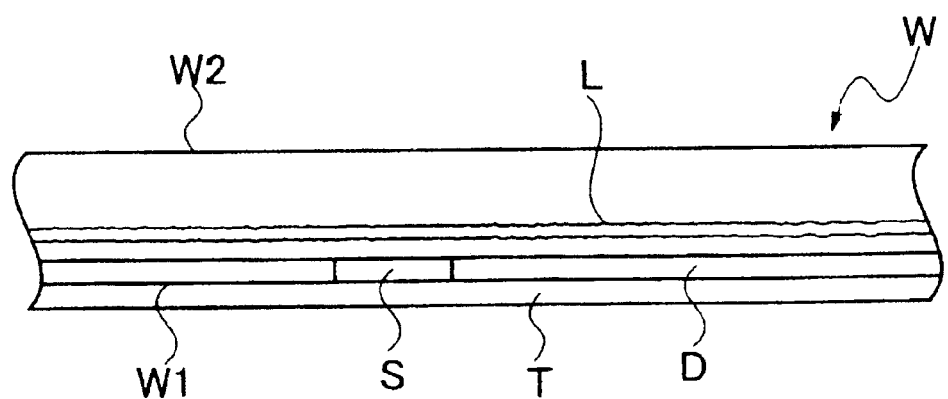
FIG. 6 is a front view of the wafer formed therein with the denatured layer.

While the chuck table 2 is being reciprocally moved in the X-axis direction at the above-mentioned feed rate and the laser beam is being so radiated that the converging point thereof is located at a position between the back-side surface W2 and the face-side surface W1 of the wafer W, for example, at a position of several tens of micrometers to the inside from the back-side surface W2, the indexing feeding means 7 puts the laser beam irradiation means 3 into indexing feed along the Y-axis direction, whereby denaturing of the wafer material occurs at the converging point of the laser beam and a denatured layer L is gradually formed along a plane as shown in FIG. 5. When the wafer W is irradiated with the laser beam from the side of the back-side surface W2 thereof over the whole area thereof, the denatured layer L is formed over the whole area of the wafer W, as shown in FIG. 6. The thickness of the denatured layer L is about 30 μm, for example. Incidentally, a process may be adopted in which, while the chuck table 2 is rotated and the wafer W is irradiated with the laser beam from the side of the back-side surface W2, the indexing feeding means 7 moves the laser beam irradiation means 3 slowly along the Y-axis direction, whereby the denatured layer is formed over the whole area by the laser beam being relatively moved in the manner of drawing a circle (a denatured layer forming step).

Figure 7:
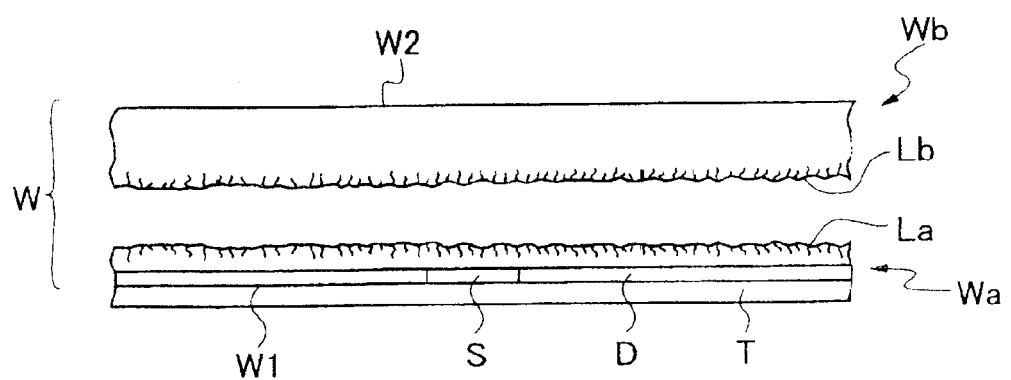
FIG. 7 is a front view showing the condition where a face-side wafer and a back-side wafer are separated from each other.
Figure 8:
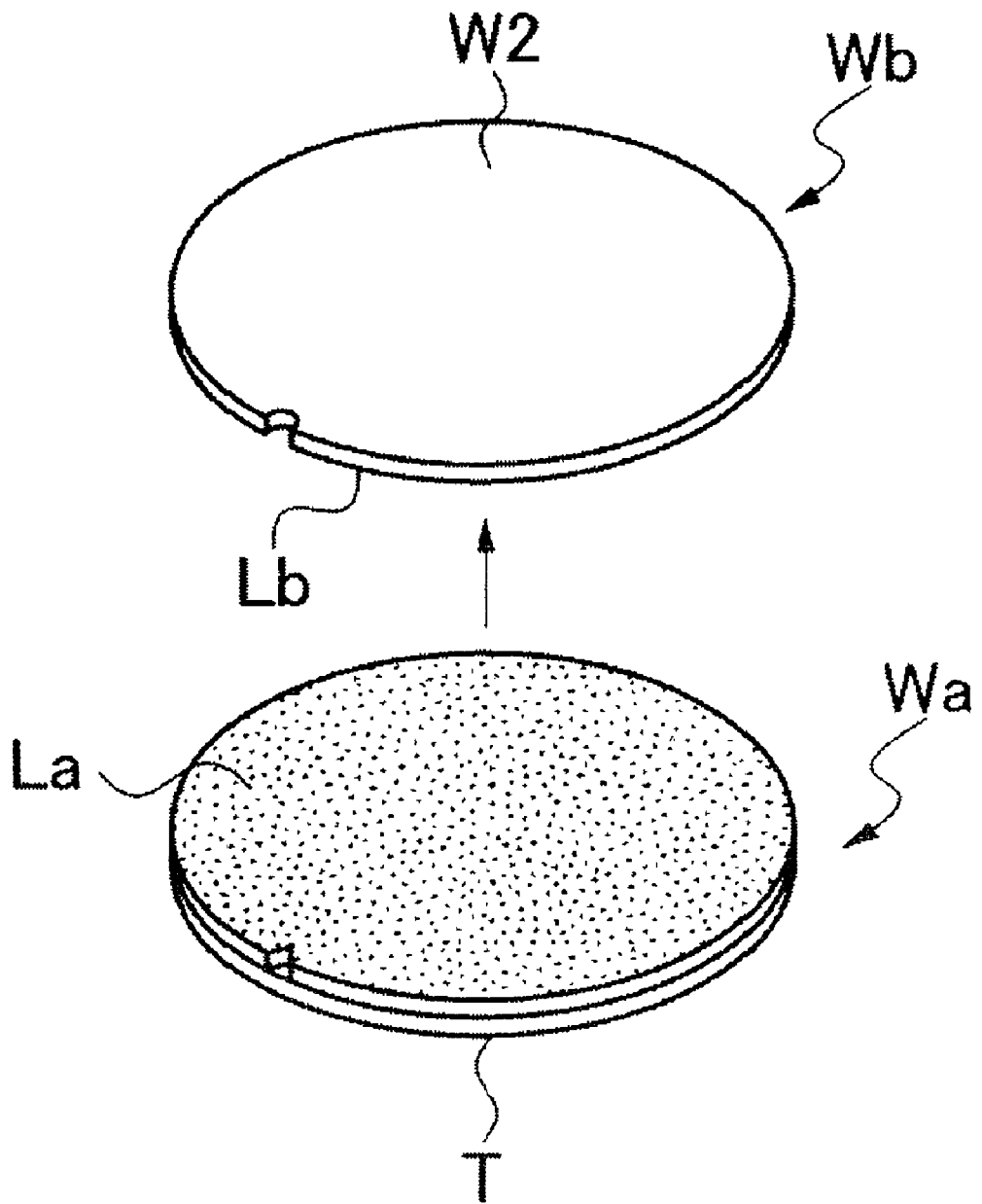
FIG. 8 is a perspective view showing a separating step.

After the denatured layer L is thus formed, as shown in FIGS. 7 and 8, the back-side wafer Wb as a member on the side of the back-side surface W2 relative to the denatured layer L can be peelingly separated from a face-side wafer Wa as a member on the side of the face-side surface W1 relative to the denatured layer L (a separating step). Since the thickness of the denatured layer L is about 30 μm, denatured surfaces La and Lb each having a thickness of around 15 μm are left at the peeled portions of the face-side wafer Wa and the back-side wafer Wb. The back-side wafer Wb thus separated is a member which retains the wafer shape and which does not have circuits fabricated therein. Therefore, the back-side wafer Wb retains its original shape and purity, and can be recycled as a semiconductor material more easily, as compared with the case where silicon grindings generated and contained in a waste liquid are recovered and recycled.

Figure 9:
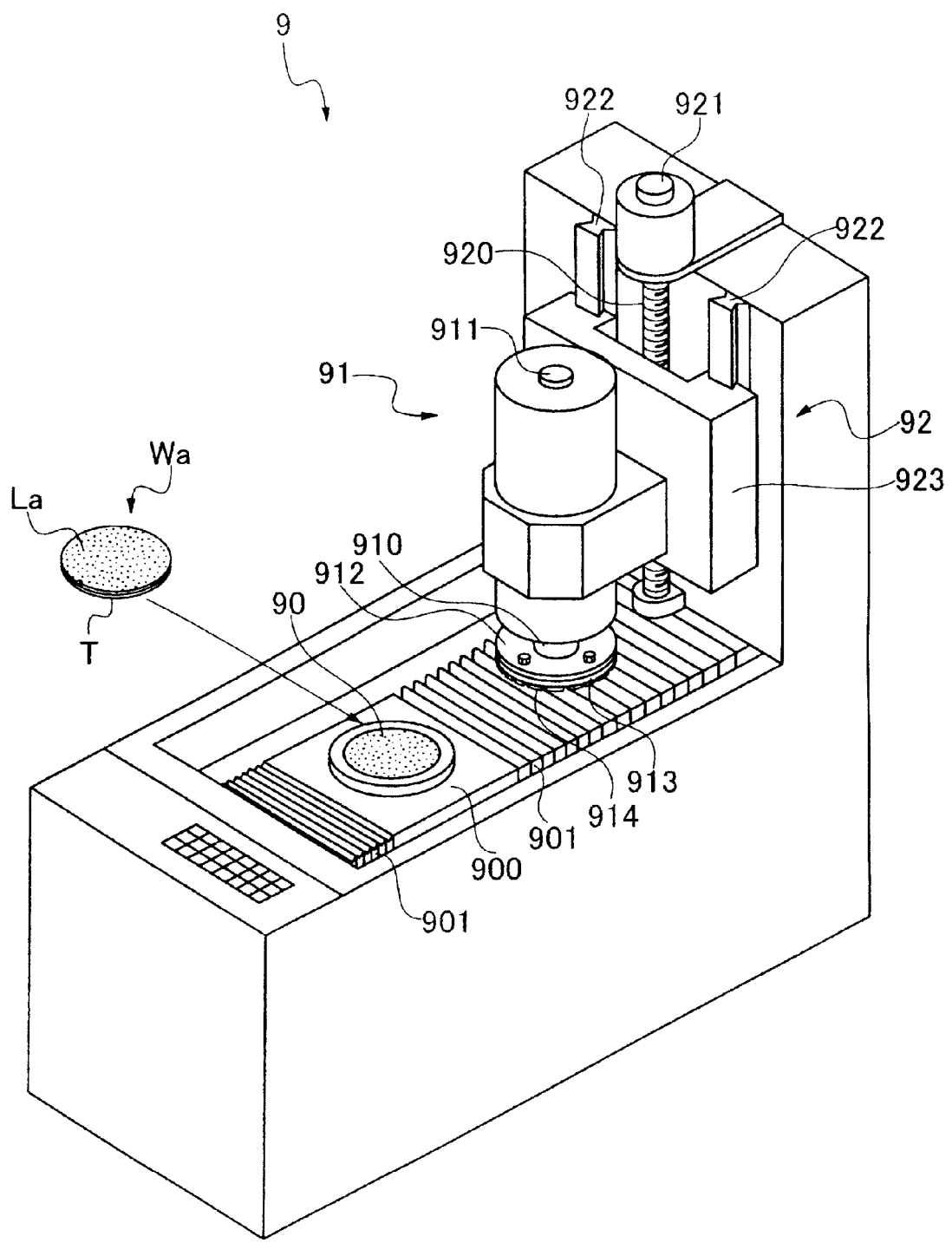
FIG. 9 is a perspective view showing an example of a grinding apparatus.

On the other hand, the face-side wafer Wa left upon peeling of the back-side wafer Wb is flattened by grinding the denatured surface La thereof by use of, for example, a grinding apparatus 9 shown in FIG. 9. The grinding apparatus 9 includes a chuck table 90 for holding the wafer as a work to be ground, grinding means 91 for grinding the wafer held on the chuck table 90, and grinding feeding means 92 for grinding feeding of the grinding means 91. The chuck table 90 is rotatably supported on a base 900. In addition, when the base 900 is moved in a horizontal direction attended by expansion/contraction of a bellows 901, the chuck table 90 is also moved horizontally.

The grinding means 91 is included of a rotating shaft 910 having an axis set in the vertical direction, a motor 911 for rotationally driving the rotating shaft 910, a wheel mount 912 formed at the lower end of the rotating shaft 910, and a grinding wheel 913 mounted to the wheel mount 912. The grinding wheel 913 has a configuration in which grinding stones 914 are firmly attached to a lower surface of a ring-shaped base along circular arcs. When the rotating shaft 910 is driven by the motor 911 to rotate, the grinding stones 914 are also rotated.

The grinding feeding means 92 is included of a ball screw 920 disposed in the vertical direction, a pulse motor 921 connected to the ball screw 920, a pair of guide rails 922 disposed in parallel to the ball screw 920, and a lift unit 923 which is provided therein with a nut (not shown) engaged with the ball screw 920, side parts of which make sliding contact with the guide rails 922 and which supports the grinding means 91. With the ball screw 920 turned in both normal and reverse directions under driving by the pulse motor 921, the lift unit 923 is lifted up and down while being guided by the guide rails 922, whereby the grinding means 91 is also lifted up and down.

Figure 10:
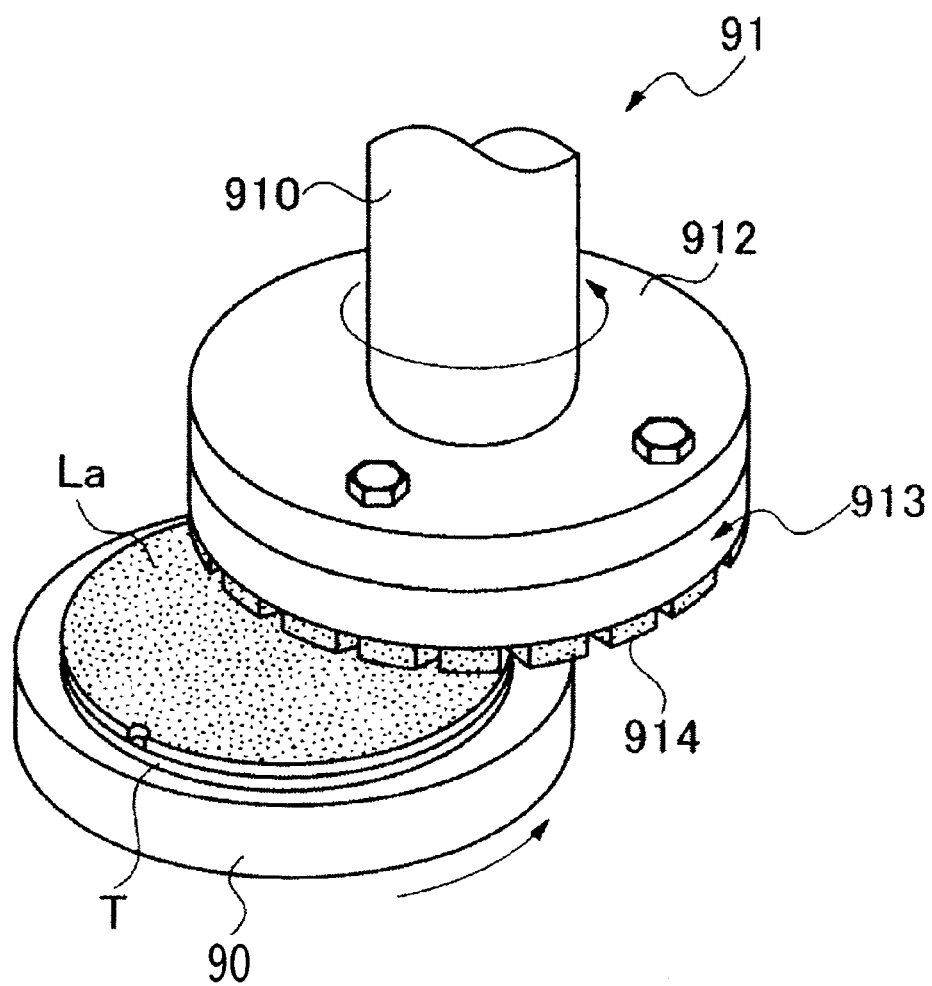
FIG. 10 is a perspective view showing a finishing step.

As shown in FIG. 9, in the chuck table 90, the side of the protective tape T adhered to the face-side wafer Wa is held, with the denatured surface La of the face-side wafer Wa being exposed. Then, the chuck table 90 is moved in a horizontal direction, whereby the face-side wafer Wa is positioned into a position directly under the grinding means 91. Then, while the chuck table 91 is being rotated at a rotating speed of, for example, 300 rpm and the rotating shaft 910 of the grinding means 91 is being rotated at a rotating speed of, for example, 6000 rpm, the grinding means 91 is moved downward at a feed rate of 1 μm/s under control of the grinding feeding means 92, whereby the grinding stones 914 in rotation are brought into contact with the denatured surface La of the face-side wafer Wa, as shown in FIG. 10, so as to grind the denatured surface La. In this case, when the grinding stones 914 are rotated normally in contact with the center of rotation of the denatured surface La, the denatured surface La is ground over the whole area thereof, and the remaining denatured portion is removed. Besides, the grinding means 91 is put to grinding feed in the vertical direction by a predetermined amount under control of the grinding feeding means 92, whereby the face-side wafer Wa can be finished to a predetermined thickness (a finishing step).

The present invention is not limited to the details of the above described preferred embodiments. The scope of the invention is defined by the appended claims and all changes and modifications as fall within the equivalence of the scope of the claims are therefore to be embraced by the Invention.

What is claimed is:

1. A method of treating a wafer provided with a plurality of devices on the face side, said method comprising:
   providing a plurality of said devices on the face side of said wafer;
   adhering a protective tape to the face side of said wafer;
   positioning said wafer upon a chuck table, face side down, such that the back side of the wafer is exposed;
   a denatured layer forming step of irradiating said wafer from the back side with a laser beam having such a wavelength as to permit transmission of said laser beam through said wafer, while adjusting a converging point of said laser beam to a predetermined depth from said back side, so as to form a denatured layer between the face side and the back side of said wafer;
   a separating step of separating said wafer into a back-side wafer on the back side relative to said denatured layer and a face-side wafer on the face side relative to said denatured layer; and
   a finishing step of removing said denatured layer remaining in said face-side wafer so as to finish said face-side wafer to a predetermined thickness;
   wherein said separating step results in said face-side wafer having a plurality of the devices formed on the face side thereof, and said back-side wafer with no devices formed thereon, and
   wherein said back-side wafer is recycled.

2. The method of treating the wafer according to claim 1, further comprising a step of grinding said face-side wafer, wherein said grinding step is performed after said separating step.

3. The method of treating the wafer according to claim 1, wherein said denatured layer forming step is performed while rotating said wafer and simultaneously irradiating a laser beam on said wafer by linearly moving a laser beam irradiation means.

4. The method of treating the wafer according to claim 1, wherein said devices are ICs.

5. The method of treating the wafer according to claim 1, wherein said devices are LSIs.

* * * * *